(12) United States Patent
Lines et al.

(10) Patent No.: US 8,699,288 B2
(45) Date of Patent: *Apr. 15, 2014

(54) PRE-CHARGE VOLTAGE GENERATION AND POWER SAVING MODES

(75) Inventors: Valerie Lines, Ottawa (CA); HakJune Oh, Ottawa (CA)

(73) Assignee: Mosaid Technologies Incorporated, Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/599,836

(22) Filed: Aug. 30, 2012

(65) Prior Publication Data

US 2012/0320695 A1    Dec. 20, 2012

Related U.S. Application Data

(63) Continuation of application No. 13/019,100, filed on Feb. 1, 2011, now Pat. No. 8,279,685, which is a continuation of application No. 12/181,115, filed on Jul. 28, 2008, now Pat. No. 7,903,477.

(60) Provisional application No. 61/032,672, filed on Feb. 29, 2008.

(51) Int. Cl.
*G11C 7/00* (2006.01)

(52) U.S. Cl.
USPC .. 365/203; 365/189.09; 365/191; 365/210.12

(58) Field of Classification Search
USPC ................ 365/191, 189.09, 203, 210.12
See application file for complete search history.

(56) References Cited

U.S. PATENT DOCUMENTS

| 5,153,459 | A | 10/1992 | Park et al. |
| 5,463,585 | A | 10/1995 | Sanada |
| 5,986,474 | A | 11/1999 | Chung et al. |
| 5,995,434 | A | 11/1999 | Ryu |
| 6,141,275 | A | 10/2000 | Tsai et al. |
| 6,243,307 | B1 | 6/2001 | Kawagoe |
| 6,477,096 | B1 | 11/2002 | Inoue |
| 6,512,715 | B2 | 1/2003 | Okamoto et al. |
| 6,721,223 | B2 | 4/2004 | Matsumoto et al. |
| 6,950,358 | B2 * | 9/2005 | Lindstedt ............... 365/201 |
| 6,992,946 | B2 | 1/2006 | Ooishi |
| 7,031,219 | B2 | 4/2006 | Hsu et al. |
| 7,126,867 | B2 | 10/2006 | Kang et al. |
| 7,218,562 | B2 | 5/2007 | Campbell |
| 7,221,606 | B2 | 5/2007 | Kang et al. |
| 7,266,009 | B2 * | 9/2007 | Chandler et al. ....... 365/145 |
| 7,903,477 | B2 * | 3/2011 | Lines et al. ......... 365/189.09 |

(Continued)

*Primary Examiner* — Pho M Luu
(74) *Attorney, Agent, or Firm* — Chapin IP Law, LLC

(57) ABSTRACT

A system includes a voltage generator to produce a pre-charge voltage signal for pre-charging one or more signals in a memory circuit. The one or more signals can be data bus lines used to access memory. The voltage generator can include an input indicating whether the memory circuit is set to a power-saving mode. According to one embodiment, the input adjusts a magnitude of the pre-charge voltage signal produced by the voltage generator. Such an embodiment is useful over conventional methods because adjusting the pre-charge voltage can result in power savings. As an example, when in the power-saving mode, the voltage generator circuit can adjust the pre-charge voltage to a value that reduces an amount of leakage current associated with a pre-charge voltage. Reducing the leakage with respect to the pre-charge voltage means that the saved power can be used for other useful purposes.

13 Claims, 10 Drawing Sheets

(56) References Cited

U.S. PATENT DOCUMENTS

| | | | |
|---|---|---|---|
| 8,174,906 B2 * | 5/2012 | Kwon et al. | 365/189.05 |
| 8,279,685 B2 * | 10/2012 | Lines et al. | 365/189.09 |
| 2007/0070746 A1 | 3/2007 | Han | |
| 2007/0201295 A1 | 8/2007 | Lines | |

* cited by examiner

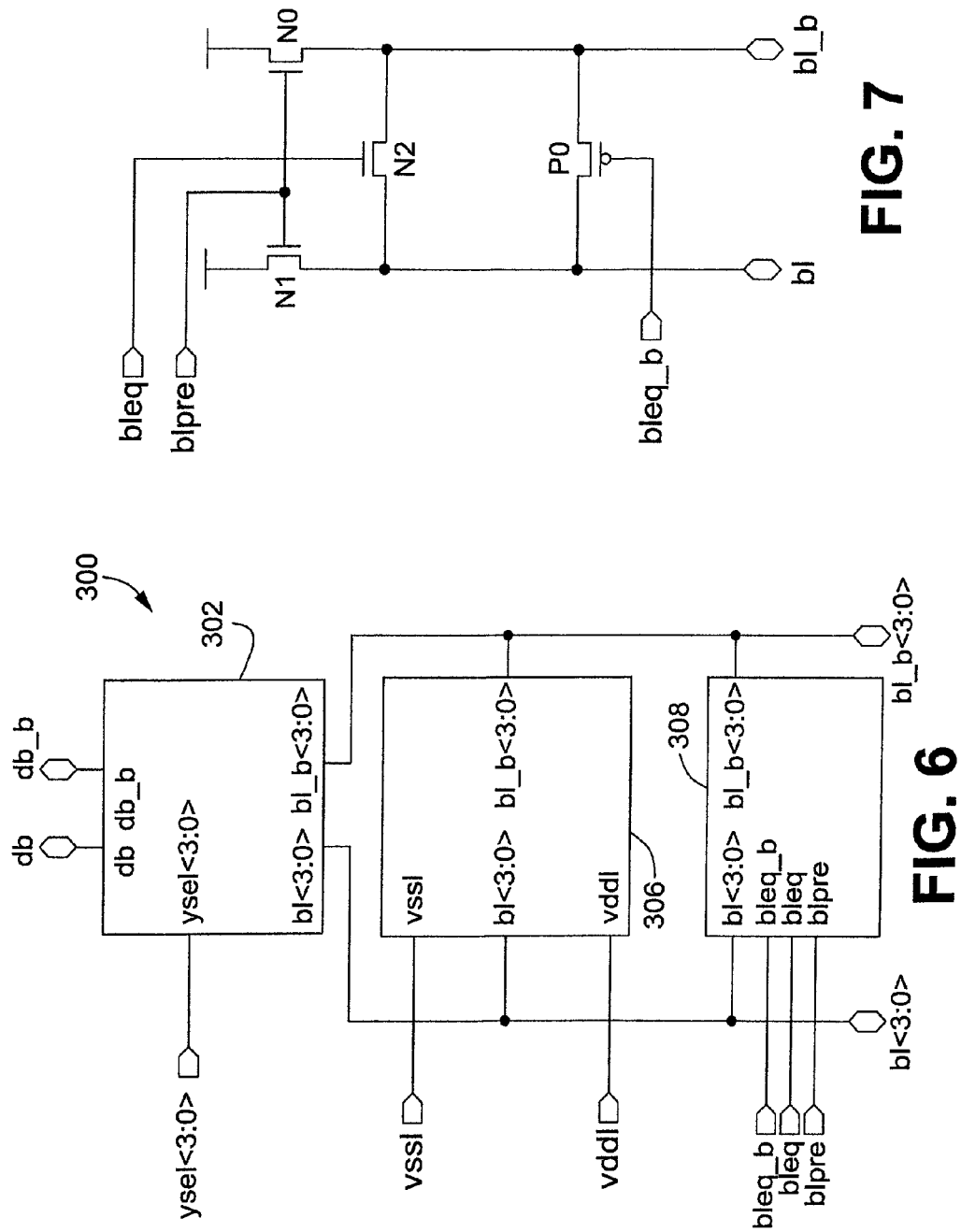

PRE-CHARGE VOLTAGE GENERATION AND POWER SAVING MODES

RELATED APPLICATIONS

This Patent Application is a Continuation of and claims priority to U.S. Pat. No. 8,279,685 issued on Oct. 2, 2012, entitled, "PRE-CHARGE VOLTAGE GENERATION AND POWER SAVING MODES," which is a Continuation of and claims priority to U.S. Pat. No. 7,903,477 issued on Mar. 8, 2011, entitled, "PRE-CHARGE VOLTAGE GENERATION AND POWER SAVING MODES," which claims the benefit of earlier filed U.S. Provisional Patent Application Ser. No. 61/032,672 entitled "BIT LINE PRECHARGE VOLTAGE CONTROL IN LOW POWER CONSUMPTION MODE," filed on Feb. 29, 2008, the entire teachings of which are incorporated herein by this reference.

BACKGROUND

Semiconductor memory devices, in particular, Random Access Memory (RAM) devices, are increasingly being used in mobile electronic devices. Since mobile electronic devices generally rely on batteries for power, rate of power consumption is an operation parameter of such devices that is closely monitored.

In response to such monitoring, semiconductor memory devices have been designed with low power consumption modes (for example, a deep power down mode during which a device is powered but does not retain data or allow access to stored data).

In general, a low power consumption mode acts as an alternative to a normal mode, in which normal operations, such as data read operations and data write operations, are required. Activation of the low power consumption mode may be triggered in a semiconductor memory device when the semiconductor memory device has not been accessed for a read operation or for a write operation for a predetermined duration.

When in the low power consumption mode, most of the internal circuitry of a respective semiconductor memory device is rendered in a "standby" state to reduce the power consumption inherent in maintaining the internal circuitry in a "ready" state.

Unfortunately, even in the low power consumption mode of operation, a semiconductor memory device can allow a flow of so-called leakage current. The leakage current of many circuits can add up quickly and result in substantial, undesirable power losses.

Some time ago, the leakage current was insignificant relative to the operating currents. However, as the size of the internal circuitry has been reduced, the significance of the leakage current has increased. Accordingly, it is becoming increasingly desirable to identify sources of leakage current and provide new ways to reduce such currents.

BRIEF DESCRIPTION OF THE DRAWINGS

Reference will now be made, by way of example, to the accompanying drawings of which:

FIG. 6 is an example diagram illustrating a bit sense amplifier for use in a memory system according to embodiments herein;

FIG. 7 is an example diagram illustrating bit line equalization circuitry for use in a memory system according to embodiments herein.

Similar or same reference numerals may have been used in the different figures to illustrate similar components or resources.

DETAILED DESCRIPTION OF ILLUSTRATED EMBODIMENTS

Figure 1:
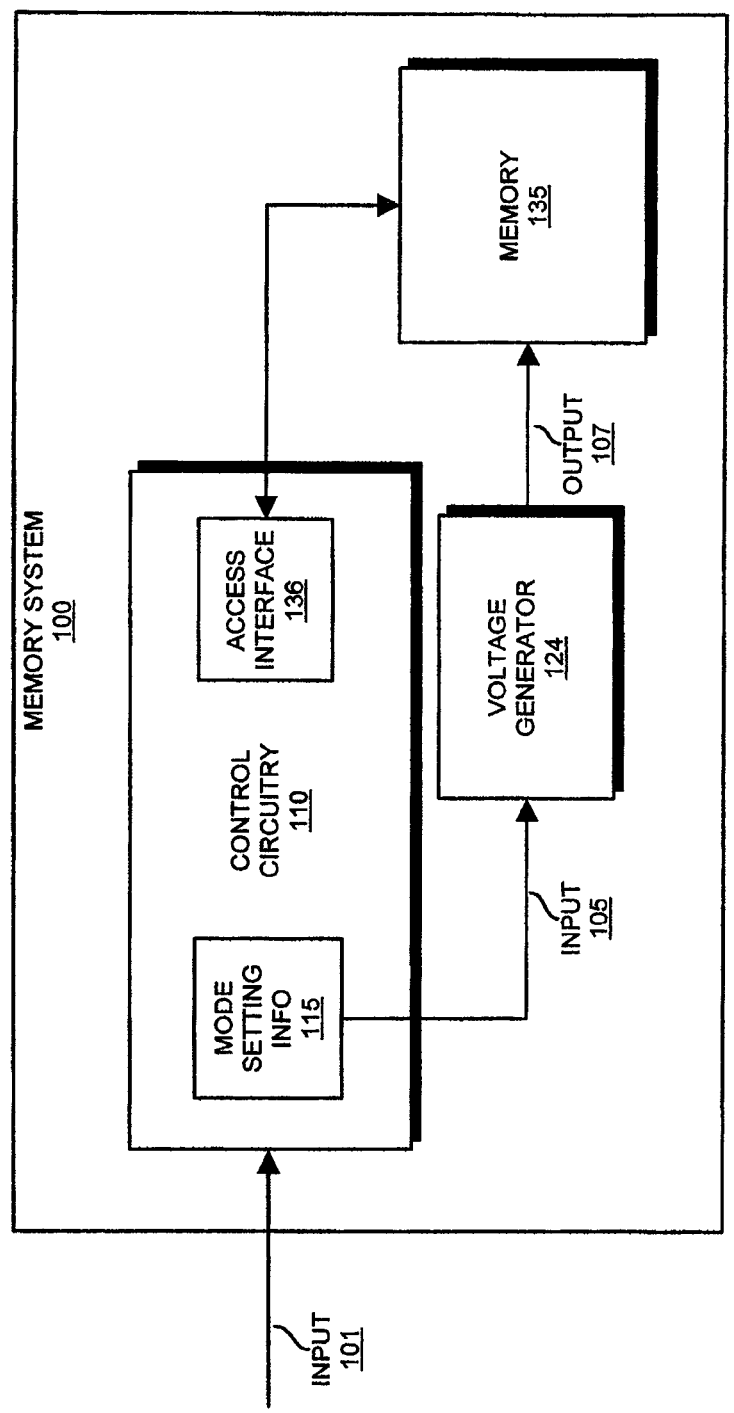
FIG. 1 is an example block diagram of a memory system including a pre-charge voltage that varies depending on a mode setting according to embodiments herein.

There are drawbacks associated with conventional methods of implementing a pre-charge voltage circuit for a corresponding memory device. For example, use of certain conventional pre-charge voltage circuits can be prone to excess power consumption as a result of leakage current from a pre-charge voltage through other neighboring circuits in the memory device. A magnitude of the leakage current can substantial during a non power-saving operational mode when the pre-charge voltage is used to pre-charge a respective one or more data bus lines to access data in a memory device. However, in such an instance, the pre-charge voltage provides the benefit of quicker memory accesses.

The magnitude of the leakage current associated with the pre-charge voltage also can be substantial during a power down mode of a respective memory device. In this latter instance, leakage with respect to the pre-charge voltage is especially undesirable because the memory is not accessible during the power-saving mode, yet the leakage results in wasted power.

In general, embodiments herein include improvements over conventional methods, systems, etc., such as, for example, those implementing a pre-charge voltage and/or a pre-charge voltage generator to aid in accessing data in memory.

For example, embodiments herein include a voltage generator configured to produce a pre-charge voltage signal for pre-charging one or more signals in a memory circuit. The one or more signals can be data bus lines used to access memory. The voltage generator can include an input indicating whether the memory circuit is set to a power-saving mode. According to one embodiment, the input adjusts a magnitude of the pre-charge voltage signal produced by the voltage generator.

Such an embodiment is useful over conventional methods because adjusting the pre-charge voltage can result in desirable power savings. As an example, when in the power-saving mode as indicated by corresponding input, the voltage generator can adjust the pre-charge voltage to a value that reduces an amount of leakage current associated with the pre-charge voltage signal. Reducing the leakage during the power-saving mode means that a battery supply will last longer without having to be replaced. Or, in more general terms, reducing the leakage with respect to the pre-charge voltage means that the saved power can be used for other useful purposes.

In accordance with further example embodiments, a voltage generator can include a voltage adjustor circuit to receive the input indicating whether the respective memory device is in a power-saving mode. As its name suggests, the voltage adjustor circuit can initiate adjusting a magnitude of the pre-charge voltage. More specifically, in response to receiving input indicating that the memory device is in a power-saving mode, the voltage adjustor circuit can increase or decrease a magnitude of the pre-charge voltage signal to initiate power savings with respect to the voltage generator and/or the produced pre-charge voltage.

According to one embodiment, adjusting the magnitude of the pre-charge voltage signal (up or down) when in the power-saving mode can include reducing a voltage difference between the pre-charge voltage signal and a voltage of a corresponding data bus signal. In other words, according to one embodiment, a data bus signal (for accessing data in the memory circuit) can be set to a predetermined state such as, for example, a logic high state during the power-saving mode. In such an instance, to reduce power consumption, the pre-charge voltage (produced by the voltage generator) can be increased from a first voltage, which is normally used for pre-charging the at least one signal during a non power-saving mode, to a second voltage during the power-saving mode.

The second voltage (a magnitude of the output of the voltage generator during the power-saving mode) can be nearer in voltage value to the logic high state than to the first voltage (a magnitude of the pre-charge voltage during the power-saving mode). Conversely, if the data bus is set to a logic low state during the power-saving mode, the magnitude of the pre-charge voltage can be set to a value nearer the logic low state instead. As mentioned above, reducing a voltage difference between the output (pre-charge voltage) of the voltage generator and the data bus in the power-saving mode reduces current leakage and thus power consumption.

Accordingly, embodiments herein include an input indicating to adjust the pre-charge voltage signal during the power-saving mode to a voltage value nearer a preset voltage value of the data bus signal to reduce current leakage through the data bus signal to other circuitry in the memory device.

At times other than during the power-saving mode during which the memory can be accessed via the data bus signal, the input can indicate to set the pre-charge voltage signal to an intermediate level between a logic high state and logic low state. Pre-charging of one or more data bus signals in a data bus signal hierarchy as described herein to an intermediate value during the non-power-saving mode enables faster access of data because a driver can more quickly change activated bus signals in the data bus signal hierarchy from an intermediate state (for example, pre-charge voltage value) to a corresponding logic high or logic low state as opposed to driving the bus from one extreme state to another.

The pre-charge voltage can be configured to selectively drive one or more differential bus pairs. Such pairs can be implemented to enhance the ability to detect when a logic high or logic low state on a respective data bus pair.

Note that in yet further embodiments, the voltage generator 124 and related circuitry can be configured to include one or more field effect transistors for adjusting a magnitude of the pre-charge voltage. For example, the pre-charge voltage can be electrically pulled up or down by a switch to a higher voltage level or lower voltage level than a voltage level of the pre-charge voltage signal as produced by the voltage generator when the memory circuit is in a non-power saving mode such as, for example, when the pre-charge voltage is used to drive one or more data bus signals in the memory circuit for accessing data stored in cells of the memory circuit.

The power-saving mode can be a so-called deep power down mode during which the memory circuit and/or respective semiconductor chip is powered, but during which no data can be accessed from the memory circuit. That is, embodiments herein can be implemented in a memory system that is continuously powered, without experiencing substantial power loss due to leakage, which may otherwise occur when implementing conventional methods during which a magnitude of the pre-charge voltage results in substantial power loss due to leakage with respective to other neighboring circuits in the memory device.

A system according to embodiments herein can include a driver circuit and switch circuitry in addition to the voltage generator. The driver circuit drives one or more data bus signals to different logic states to access the memory device. Recall that the pre-charge voltage can be used to pre-charge the data bus for accessing memory.

One type of access is a memory access in which the drive circuit writes data to memory during the non power-saving mode. The switch circuitry can be configured to selectively couple a pre-charge voltage signal (as produced by the voltage generator) to the one or more data bus signals to support quicker memory accesses.

As previously discussed, an input into the voltage generator according to embodiments herein can indicate when the memory circuit is set to a power-saving mode. When in a power saving mode, the voltage generator adjusts the magnitude of the pre-charge voltage to reduce leakage of current on a path from the pre-charge voltage signal through the switch circuit to the one or more data signal in the memory system.

As a more specific example illustrating leakage, the switch circuitry can be set to an OFF state during the power-saving mode to electrically decouple the pre-charge voltage signal from the one or more data bus signals in the memory system. However, a current leakage path can extend from the driver circuit along or through a data bus through a respective switch of the switch circuitry to the voltage generator circuit.

According to further embodiments herein, a voltage generator includes an input and output. In this latter embodiment, the input of the voltage generator specifies a mode setting of a corresponding memory circuit. During a first mode such as, for example, a non-power-saving mode, the output is set to a first voltage for pre-charging one or more data bus signals in a data bus signal hierarchy in the memory system. During this first mode, cells in the memory circuit are accessible and the first voltage is used as a pre-charge voltage to support memory accesses. During a second mode setting such as, for example, a power-saving mode, the output is set to a second voltage. In this second mode, the cells in the memory circuit are inaccessible.

According to one embodiment, the memory circuit retains data during the non power-saving mode and loses data during the power-saving mode.

Because the output of the voltage generator 124 may not needed to pre-charge the data bus during the second mode, the output can be set to a voltage magnitude that supports power savings.

In further embodiments, during the first mode setting, the one or more data bus signals is driven to different logic states such as, for example, a logic high state and a logic low state depending on an output of a driver circuit. During the second mode setting, the one or more data bus signals can be driven to a single predetermined logic state.

In such an embodiment, a magnitude of the first voltage can be a pre-charge voltage set in an intermediate range between the logic high state and the logic low state. That is, the first voltage such as, for example, an intermediate voltage can be used to pre-charge the at least one data bus signal for a memory access. The second voltage can be set nearer in value to one of the logic high state and the logic low state as opposed to be set to a value nearer in magnitude to the first voltage value. Setting the second voltage nearer in value to the logic high or logic low state can reduce leakage current (to reduce energy consumption) through corresponding switch circuitry to the data bus by decreasing the voltage difference between the output of the voltage generator and the voltage of the data bus. Additionally, the output can be set to the second voltage in lieu of the first voltage during the second mode setting to reduce a leakage of current from the at least one data bus through the switch circuit to the output.

In further embodiments, a driver circuit can be configured to drive the one or more data bus to a predetermined logic state during the second mode setting. The output of the voltage generator during the second mode can be set to a respective value such that a voltage difference between the second voltage and the predetermined logic state is less than a voltage difference between the first voltage and the predetermined logic state.

The voltage generator, memory and related circuitry as described herein can be used in a number of different power saving applications. By way of a non-limiting example, the voltage generator circuit can be configured to reside in a mobile communications device such as, for example, a mobile phone, cellular phone, wireless phone, wirelessly-enabled handheld device, etc. In such instances, the input specifies when the mobile communications device is in a deep power-saving mode during which cells in the memory circuit do not retain stored data. During such a mode, changing the magnitude of the pre-charge voltage provides power savings. Thus, a pre-charge voltage value is set to a useful value depending on a respective mode setting of the device.

These and other embodiments will be discussed in more detail later in this specification with reference to corresponding figures.

As discussed above, techniques herein are well suited for use in one or more memory devices and/or systems such as those supporting use of data bus signals and/or a data bus signal hierarchy in different applications. Some of these different applications may include, for example, flash technology, electrically erasable semiconductor memory, volatile memory, non-volatile memory, etc. However, it should be noted that some embodiments herein are not limited to use in such applications and that some of the techniques discussed herein are well suited for other applications as well.

Additionally, although each of the different features, techniques, configurations, etc., herein may be discussed in different places of this disclosure, it is generally intended that each of the concepts can be executed independently of each other or in combination with each other where feasible. Accordingly, at least some example embodiments of the invention can be embodied and viewed in many different ways.

Now, more particularly, FIG. 1 is an example diagram illustrating a memory system 100 according to embodiments herein. Memory system 100 includes control circuitry 110, voltage generator 124, and memory 135. Control circuitry 110 includes mode setting information 115 and access interface 136.

During one mode of operation, memory 135 stores data. As its name suggests, access interface 136 supports reads and/or writes to cells in memory 135. Voltage generator 124 produces an output 107 such as, for example, a pre-charge voltage value facilitating access to memory 135.

In one embodiment, the output 107 produced by voltage generator 124 is selectively coupled to one or more signals in memory 135 prior to the one or more signals being use to perform a function such as, for example, a memory access. Pre-charging one or more signals in the memory system 100 can reduce the amount of time needed to perform a corresponding function.

According to embodiments herein, a magnitude of the output 107 varies depending on mode setting information 115. For example, when mode setting information 115 and corresponding input 105 (which specifies the mode setting of memory system 100) indicate that the memory system 100 is in a power-saving mode, the voltage generator 124 generates the output 107 to be a first voltage magnitude (or within a first voltage range). When mode setting information 115 and corresponding input 105 indicate that the memory system 100 is in a normal operational mode or non power-saving mode, the voltage generator 124 generates the output 107 to be a second voltage magnitude (or within a second voltage range).

As will be discussed later in this specification, changing a magnitude of the voltage at output 107 to the second voltage saves energy by reducing an amount of leakage current with respect to output 107 and other circuitry such as, for example, memory 135, access interface 136, etc.

As mentioned above, such an embodiment is beneficial because adjusting output 107 as described herein can result in desirable power savings over conventional methods.

As an example, when in the power-saving mode as indicated by corresponding input 105, the voltage generator 124 can adjust the output 107 or a pre-charge voltage to a value that reduces an amount of leakage current associated with the output 107 and corresponding circuitry. Reducing the leakage during the power-saving mode means that a battery supply will last longer without having to be replaced. Or, in more general terms, reducing the leakage with respect to the output 107 during the power-saving mode means that the saved power can be used for other useful purposes.

Note that the memory 135 may be any suitable type of circuitry enabling storage/access of data. By way of a non-limiting example, the memory 135 can include applications in which a pre-charge voltage facilitates access to the stored data. Specific applications for implementing embodiments herein may include, without limit, DRAM, SRAM, PSRAM, ReRAM, FeRAM, NAND Flash memory, NOR Flash memory, EEPROM, MRAM, PCM, SRAM, PSRAM and DRAM, etc.

However, note further that use of non-memory chips or integrated circuits is also contemplated in accordance with some embodiments herein. For example, the principles as described herein can be extended to applications in which a pre-charge voltage is subject to leakage and power loss during respective power-saving modes.

Figure 2:
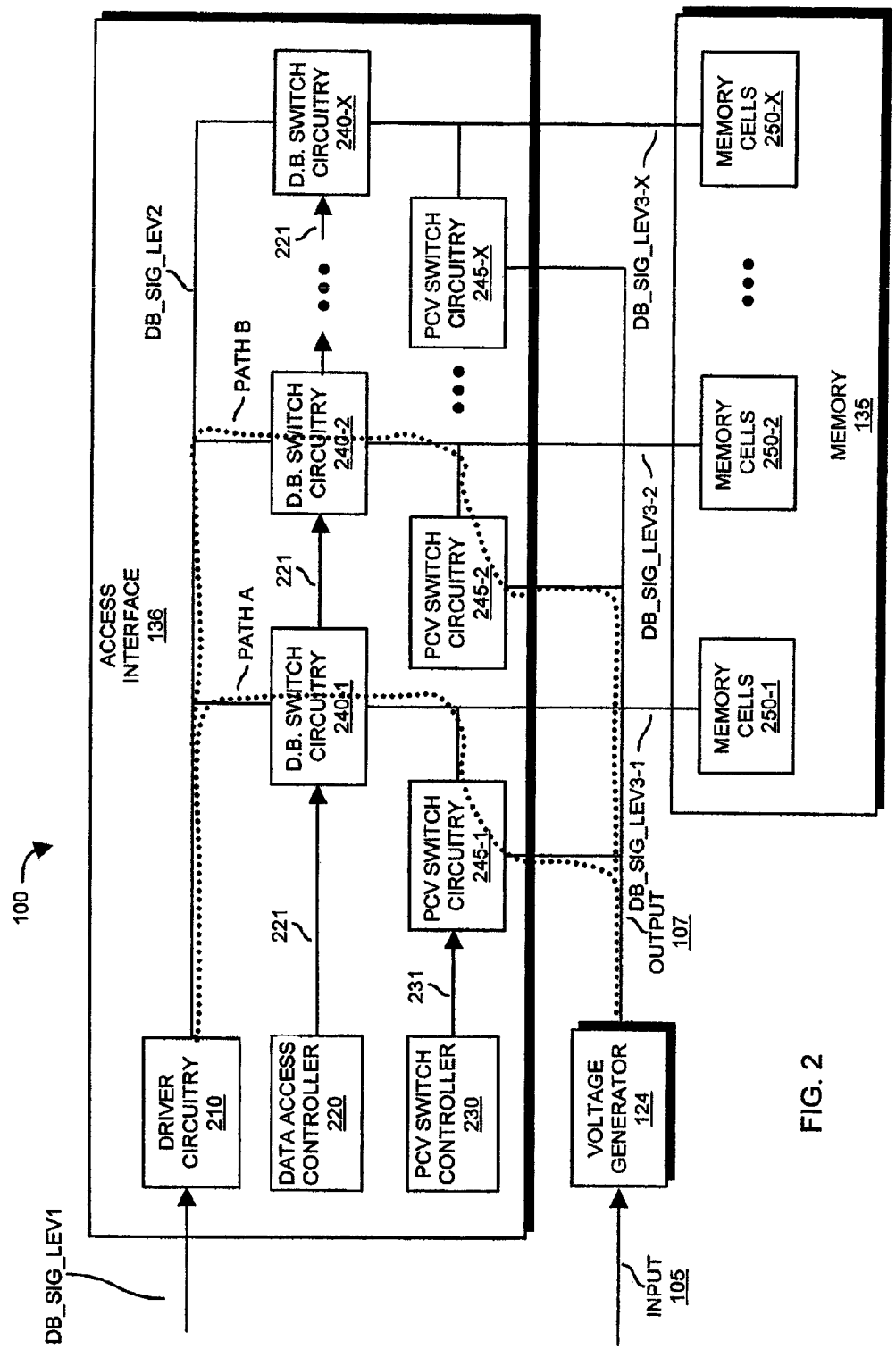
FIG. 2 is an example block diagram of a memory system including a data bus pre-charge voltage that varies depending on whether the memory system is set to a power-saving mode according to embodiments herein.

FIG. 2 is a diagram illustrating details of an example memory system 100 according to embodiments herein. As shown, memory system 100 includes voltage generator 124, access interface 136, and a memory 135.

In this example embodiment, the access interface 136 includes driver circuitry 210, data access controller 220, pre-charge voltage switch controller 230, pre-charge voltage switch circuitry 245 (for example, pre-charge voltage switch circuitry 245-1, pre-charge voltage switch circuitry 245-2, . . . , and pre-charge voltage switch circuitry 245-X), and data bus switch circuitry 240 (for example, data bus switch circuitry 240-1, data bus switch circuitry 240-2, . . . , and data bus switch circuitry 240-X). The memory 135 includes groupings of memory cells 250 (for example, memory cells 250-1, memory cells 250-2, ..., and memory cells 250-X).

As discussed below, the data bus switch circuitry 240 enables control of data bus signals in a respective data bus signal hierarchy formed by "switchable" paths from a global signal such as, for example, signal DB_SIG_LEV1 to specific cells in the memory 135. The pre-charge voltage circuitry 245-1 enables pre-charging of one or more paths or data bus signals in the data bus signal hierarchy.

More specifically, data bus signal DB_SIG_LEV1 (for example, a global data signal) is in switchable communication with one or more memory cells 250 of memory 135. For example, to write data to memory 135, the driver circuitry 210 can drive DB_SIG_LEV2 to a logic level by enabling the driver circuitry 210 and controlling a logic state of signal DB_SIG_LEV1.

During operation, access controller 220 produces control signals to activate one or more of switch circuitry 240. Activation of switch circuitry 240 provides a low impedance path to convey the logic state of DB_SIG_LEV2 to one or more groupings of memory cells 250.

Additional circuitry in memory 135 can be activated to convey the logic signal at DB_SIG_LEV3 to one or more storage cells. In this way, a bus signal such as, for example, DB_SIG_LEV1 can be electrically coupled to successively lower levels in a data bus signal hierarchy to store data to one or more specific cells in memory 135.

Note that in a similar manner, switch circuitry 240 can be configured to allow retrieval of data stored in memory 135. In such an embodiment, data access controller 220 activates appropriate switch circuitry in the memory 135 to retrieve data from specific cells in memory 135. In this latter application, the driver circuitry 210 is a receiver instead of a driver.

Thus, as mentioned above, the memory system 100 can include a data bus signal hierarchy in which data bus signal paths are formed via activation of respective switches in the data bus signal hierarchy to access memory cells.

Also, as will be discussed later in this specification, note that the pre-charge voltage produced by voltage generator 124 can be configured to pre-charge differential bus signal pairs. In other words, data bus signal DB_SIG_LEV1 can be part of a pair of bus signals, data bus signal DB_SIG_LEV2 can be part of a pair of bus signals, and so on. Such pairs can be implemented to enhance the ability to detect when a logic high or logic low state on a respective data bus pair. This is discussed in more detail later in this specification.

As previously discussed, the memory system can include a voltage generator 124 to produce output 107 such as, for example, a pre-charge voltage. To speed up an access during a non power-saving mode as discussed above, the pre-charge voltage switch controller 230 can produce a set of control signals 231 to drive pre-charge voltage switch circuitry 245 and set one or more of data bus signals labeled DB_SIG_LEV3 to the pre-charge voltage produced by voltage generator 124 at output 107. In other words, according to one embodiment, based on input from pre-charge voltage switch controller 230, the switch circuitry 245 can be configured to selectively couple a pre-charge voltage signal such as, for example, output 107 (as produced by the voltage generator 124) to one or more data bus signals in a data bus signal hierarchy to support quicker memory accesses.

In one embodiment, the input 105 can indicate to set the output 107 to an intermediate level between a logic high state and logic low state produced by driver circuitry 210 during the non power-saving mode. By way of a non-limiting example, the intermediate level can be at least substantially half way between the logic high and logic low state produced by the driver circuitry 210.

Pre-charging of one or more data bus signals to an intermediate value during the non-power-saving mode enables faster access of data because a driver can more quickly change drive the bus from intermediate state (for example, pre-charge voltage value) to a corresponding logic high or logic low state as opposed to driving the bus from one extreme state to another.

Pre-charging can be achieved by temporarily coupling the output 107 of the voltage generator 124 through an activated pre-charge voltage switch circuitry 245 to a bit line such as, for example, DB_SIG_LEV3-1. In other words, to set DB_SIG_LEV3-1 to the pre-charge voltage (output 107) produced by voltage generator 124, the pre-charge voltage switch controller 230 temporarily activates switch circuitry 245-1 to provide a low impedance path from the output 107 through the switch circuitry 245-1 to the DB_SIG_LEV3-1 signal to pre-charge the DB_SIG_LEV3-1 signal to the pre-charge voltage. Switch circuitry 245 can include one or more switches to provide a respective high or low impedance path depending on whether the memory system 100 is in a pre-charge phase.

In this way, the pre-charge voltage controller 230 can initiate activation of any of pre-charge voltage switch circuitry 245 to set the corresponding data bus signal at level 3 of the data bus signal hierarchy to the pre-charge voltage level. Thereafter, as discussed above, after setting a data bus to the pre-charge voltage value, access controller 220 activates one of switch circuitry 240 to drive the appropriate one or more data bus signals at level 3 to a logic state for storage in memory 135. This process can be repeated to retrieve data from or store data to a specific one or more memory cell.

As previously discussed, input 105 can indicate when the memory sub-tasks 100 is set to a power-saving mode. When in a power saving mode, the voltage generator 124 adjusts the magnitude of the output 107 to reduce leakage of current on one or more paths from the output 107 through the switch circuitry 245 and/or switch circuitry 240 to the level 2 data signal such as, for example, DB_SIG_LEV2.

As a more specific example illustrating leakage, note that the switch circuitry 245-1 and switch circuitry 240-1 can be set to an OFF state during the power-saving mode to electrically decouple or provide a high impedance path between the output 107 of voltage generator 124 to the driver circuitry 210. However, even though switches in path A are shut OFF, the amount of leakage current along path A from the driver circuit 210 to voltage generator 124 or from the voltage generator 124 to the driver 210 can be significant, especially in the power-saving mode when the access interface is not used to access memory 135. The overall leakage associated with the data bus signal hierarchy in memory system 100 can be substantial because leakage from path A, path B, and other such paths between the voltage generator 124 and the driver circuit 210 or other neighboring circuitry are additive. For instance, a magnitude of the leakage current increases depending on how many columns (for example, groupings of memory cells 250) or data buses are present at level 3 (for example, DB_SIG_LEV3-1, DB_SIG_LEV3-2, ...) and other deeper levels in the data bus signal hierarchy.

According to one embodiment, adjusting the magnitude of output 107 (up or down to reduce power consumption) when in the power-saving mode can include reducing a voltage difference between the output 107 and a voltage of a corresponding data bus signal such as, for example, data bus signal DB_SIG_LEV1.

In other words, according to one embodiment, during the power-saving mode, the output of driver circuitry 210 can be set to a logic high state during the power-saving mode. In such an instance, to reduce power consumption, the output 107 of voltage generator 124 can be increased from a first voltage such as a pre-charge voltage value normally used for pre-charging the at least one signal during the non power-saving mode, to a second voltage during the power-saving mode.

In one embodiment, the second voltage magnitude of the pre-charge voltage during the power-saving mode is nearer in voltage value to the logic high state than to the first voltage. For example, according to one embodiment, the output 107 of voltage generator 124 can be set to a value in between the logic high state and logic low state outputted by driver circuitry 210 at signal DB_SIG_LEV2. As mentioned, reducing a voltage difference between the output 107 and the output of driver circuitry 210 while in the power-saving mode reduces power consumption.

Accordingly, embodiments herein include an input 105 indicating to adjust the output 107 during the power-saving mode to a voltage value nearer a preset voltage value of a data bus signal to reduce current leakage. More specifically, if the driver circuitry 210 is set to a logic high state during the power-saving mode, the voltage generator 124 can adjust the magnitude of the output 107 to be at least substantially a logic high state so that current losses on paths between voltage generator 124 through switch circuitry 240 and switch circuitry 245 are reduced as compared to an amount of losses that would occur if the output 107 was maintained at the same pre-charge voltage level used during the non power-saving mode as in conventional methods.

As mentioned above, the driver circuitry 210 can be configured to drive one or more data bus signals in the hierarchy to a predetermined logic state during the second mode setting. The output of the voltage generator 124, during the power-saving mode, can be set to a respective value such that a voltage difference between the second voltage and the predetermined logic state of driver circuitry 210 is less than a voltage difference between the first voltage and the predetermined logic state of driver circuitry 210. In other words, assume that the voltage generator 124 sets output 107 to half the magnitude of $V_{DD}$ (recall that $V_{DD}$ is, for example, a logic high state). According to one embodiment, the voltage generator 124 sets output 107 to a magnitude nearer a value of $V_{DD}$ than to a magnitude of half $V_{DD}$.

Figure 3:
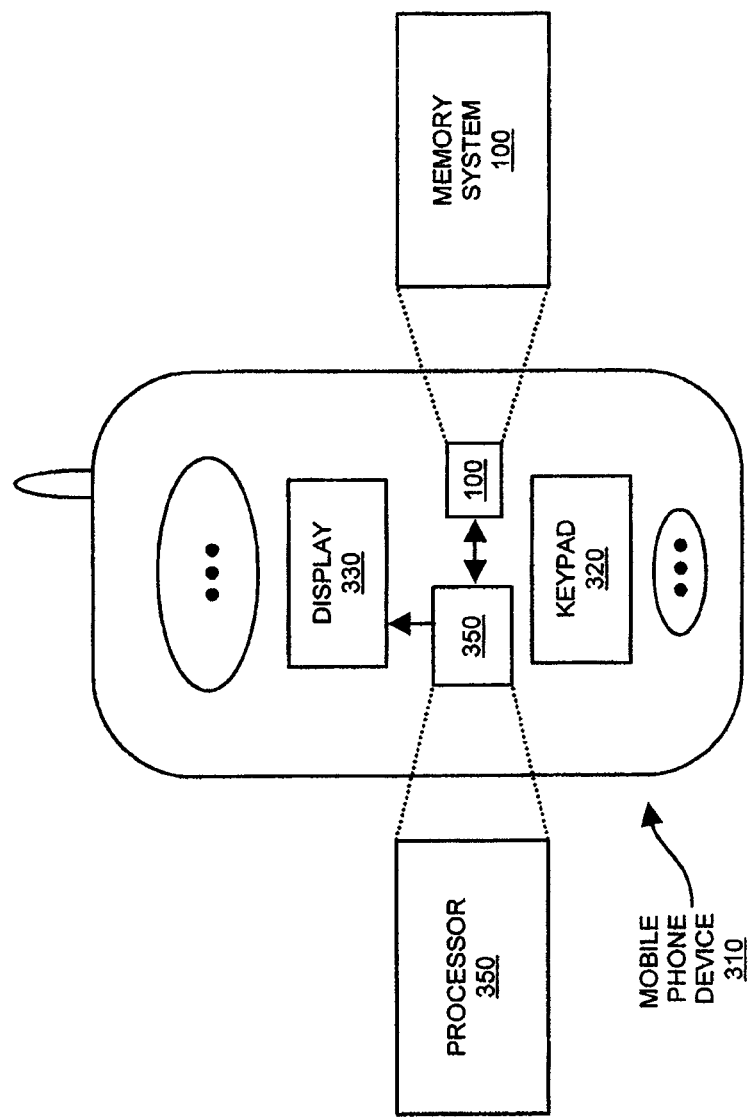
FIG. 3 is a diagram illustrating an example application of multiple possible applications for implementing a power-saving memory system according to embodiments herein.

FIG. 3 is an example diagram of an electronic device implementing a memory system 100 according to embodiments herein. By way of a non-limiting example, the voltage generator 124 can be configured to reside in a mobile communications device 310 such as, for example, a mobile phone, cellular phone, wireless phone, wirelessly-enabled handheld device, etc.

In such instances, the input 105 to a corresponding voltage generator 124 in memory system 100 specifies when the mobile communications device 310 is in a so-called deep power-saving mode during which cells in the memory 135 may not retain stored data even though the memory circuit is continuously powered by external supplies. During the deep power down mode, the memory system 100 may be configured so that data is retained but cannot be accessed.

As mentioned above, changing the magnitude of the pre-charge voltage in the mobile communications device 310 can provide power savings over conventional techniques by reducing an amount of leakage from the pre-charge voltage or output 107 produced by voltage generator 124 to other neighboring circuits in the memory 135.

Upon detecting that the mobile communications device 310 becomes activated for use such as, for example, to make an outbound call, modify personal information, etc., after being in a deep power down mode, the voltage generator 124 in memory system 100 responds by adjusting the pre-charge voltage output so that memory system 100 is in an operational mode for storage of data. During the operational mode, the processor 350 can access memory cells in memory system 100. Thus, a pre-charge voltage value in the mobile communications device 310 can be set to an appropriate value depending on a respective mode setting of the device.

Note again that mobile communications device 310 is shown by way of non-limiting example only and that the memory system 100 any or all of the voltage generator 124, memory 135 and related circuitry as described herein can be used in a number of different power saving applications.

Figure 4:
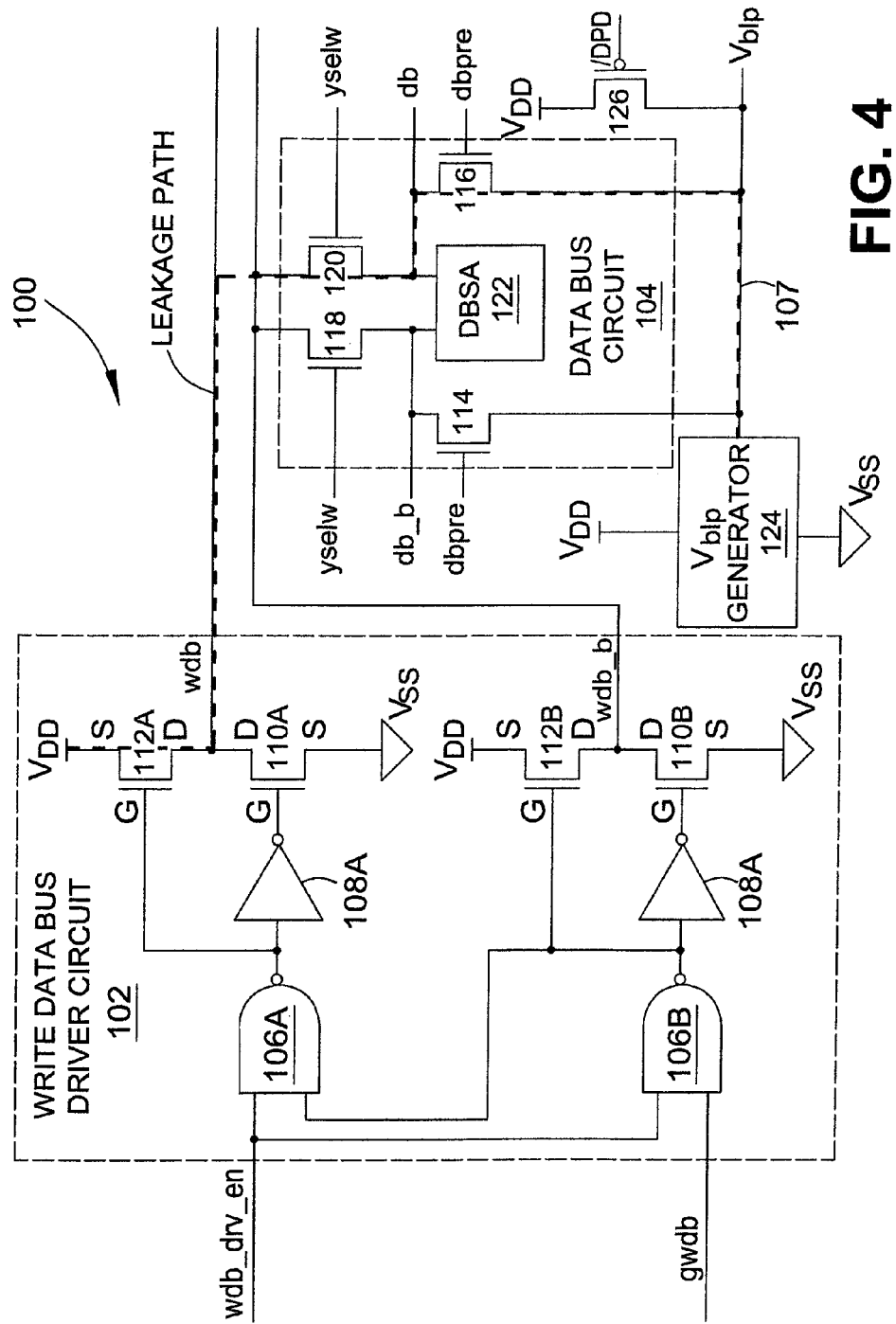
FIG. 4 is a diagram illustrating an example portion of a semiconductor memory device and corresponding internal circuitry according to embodiments herein.

FIG. 4 is a diagram illustrating an example portion of internal circuitry of a semiconductor memory device according to embodiments herein.

Responsive to changing a bit line pre-charge voltage ($V_{BLP}$) produced by voltage generator 124, to reduce a voltage difference between a voltage on a write data bus (signal wdb) and the bit line pre-charge voltage ($V_{BLP}$), there is a reduction in the current flowing on a leakage path while a low power consumption mode is active. In accordance with this example embodiment, there is provided a method of controlling the bit line pre-charge voltage ($V_{BLP}$). For example, the method includes receiving an indication such as, for example, signal/DPD (a signal indicating when a power down mode occurs) that the circuit is entering a low power consumption mode and responsive to the receiving, changing a magnitude of a voltage at the output 107.

As shown in FIG. 4, the illustrated portion includes a write data bus driver circuit 102 and a data bus circuit 104.

The output of the write data bus driver circuit 102 includes signal wdb (write data bus) and signal wdb_b (write data bus bar). During operation, the signal wdb_b is a logical inverse of signal wdb. More specifically, the signal wdb is logic high when signal wdb_b is a logic low. Conversely, the signal wdb is logic low when signal wdb_b is a logic high. These data bus signals form a differential pair.

The output of write data bus circuit 102 can be configured to drive multiple memory circuits equivalent to the single illustrated data bus circuit 104. In other words, it will be understood that for convenience of illustration only one data bus circuit 104 is shown in FIG. 4. Typically, the ratio of wdb pairs to corresponding circuits such as, for example, circuits 104 will be one to many in a similar manner that access interface 136 in FIG. 2 includes sets of duplicated switch circuitry 240 for accessing groupings of memory cells 250.

With further reference to the example embodiment shown in FIG. 4, the write data bus driver circuit 102 includes input such as, for example, an enable signal (wdb_drv_en) for enabling the write data bus driver circuit 102. The write data bus driver circuit 102 also includes a global write data bus signal (gwdb) as input.

The enable input (wdb_drv_en) is electrically connected, within the write data bus driver circuit 102, to an input of a first two-input NAND logic gate 106A and to an input of a second two-input NAND logic gate 106B. The global write data bus signal is coupled, within the write data bus driver circuit 102, to an input of the second NAND logic gate 106B.

The output of the second NAND logic gate 106B is electrically connected to an input of the second of the two inputs to the first two-input NAND logic gate 106A. The output of the first two-input NAND logic gate 106A is electrically connected to the input of a first inverter 108A. The output of the second two-input NAND logic gate 106B is electrically connected to the input of a second inverter 108B.

Continuing on in the description of the example embodiment shown in FIG. 4, the output of the first inverter 108A is electrically connected to a gate of a first lower n-type Metal Oxide Semiconductor (NMOS) transistor 110A.

As is inherent in MOS transistors, the first lower NMOS transistor 110A also has a source and a drain. The source of the first lower NMOS transistor 110A is electrically connected to a source supply voltage ($V_{SS}$). The drain of the first lower NMOS transistor 110A is electrically connected to the source of a first upper NMOS transistor 112A. The drain of the first upper NMOS transistor 112A is electrically connected to a drain supply voltage ($V_{DD}$). The gate of the first upper NMOS transistor 112A is electrically connected to the output of the first two-input NAND logic gate 106A. The drain of the first lower NMOS transistor 110A is electrically connected to the source of the first upper NMOS transistor 112A. As shown, this electrical juncture produces the wdb signal.

Still with reference to the example embodiment shown in FIG. 4, the output of the second inverter 108B is electrically connected to the gate of a second lower NMOS transistor 110B. The source of the second lower NMOS transistor 110B is electrically connected to the source supply voltage ($V_{SS}$). The drain of the second lower NMOS transistor 110B is electrically connected to the source of a second upper NMOS transistor 112B. As shown, this electrical juncture produces the wdb_b signal.

The drain of the second upper NMOS transistor 112B is electrically connected to a drain supply voltage ($V_{DD}$). The gate of the second upper NMOS transistor 112B is electrically connected to the output of the second two-input NAND logic gate 106B. The node where the drain of the second lower NMOS transistor 110B is electrically connected to the source of the second upper NMOS transistor 112B provides the wdb_b output.

In accordance with at least some examples, a semiconductor memory device includes at least one memory block having a plurality of memory cells arranged in rows and/or columns. In each such memory block, a plurality of word lines can be arranged corresponding to respective memory cell rows. A plurality of bit line pairs can be arranged corresponding to respective memory cell columns.

In a further example memory block, word lines can be arranged corresponding to memory cell rows and bit line pairs can be arranged corresponding to memory cell columns.

For a semiconductor memory system 100 within which the circuitries illustrated in FIGS. 4-7 are present, it will be understood that data can be written to memory cells of the semiconductor memory device by activating data bus signals deeper and deeper down a corresponding data bus signal hierarchy to a cell being accessed.

For example, firstly, data received by the memory device at signal gwdb (for example, from a controller of the memory system) will be decoded via write drive circuit 102 as mentioned. When the signal wdb_drv_en is a logic high, the drive circuit 102 is enabled. When so enabled, the output (signal wdb and signal wdb_b) of the driver circuit 102 varies depending on a state of input signal gwdb. That is, when the driver circuit 102 is enabled, setting signal gwdb to a logic high state causes signal wdb to be a logic high and wdb_b to be a logic low. When the driver circuit 102 is enabled, setting signal gwdb to a logic low state causes signal wdb to be a logic low and wdb_b to be a logic high.

Thus, as discussed briefly above, signal wdb and signal wdb_b form a differential data bus signal pair.

Signals yselw can be controlled to activate respective switches 118 and 120. Depending on a state of transistors 118 and 120, the differential data bus signal pair (wdb and wdb_b) is electrically connected to a lower level data bus signal pair comprising signal db and data bus_b. In other words, when activated, transistor 118 electrically couples signal wdb to signal db and transistor 120 electrically couples signal wdb_b to signal db_b.

Via additional control signals, note that the data bus signal pair comprising signal db and signal db_b can be connected to yet lower level circuitry such as, for example, bit lines (and possibly further level data bus signals and corresponding circuitry) for writing of data on the data bus to memory. The lower level circuitry also can include additional deeper levels of data bus signals. In this way, a global write data bus signal can be electrically coupled successively deeper and deeper in an overall data bus hierarchy to access specific cells in memory.

In addition to including transistors 118 and 120 supporting functionality as discussed above, note that data bus circuit 104 can further include transistors 114 and 116 (for example, NMOS transistors) as well as a data bus sense amplifier circuit (DBSA) 122.

As described herein, the transistors 114 and 116 support pre-charging of the data bus signals to facilitate quicker accesses to data. The data bus sense amplifier 122 facilitates functions such as changing the data bus signals to appropriate logic states for storage and/or retrieval of data from memory.

Continuing with the description of the example embodiment shown in FIG. 4, the complementary pair of data bus lines (signal db and signal db_b) are individually coupled to a bit line pre-charge voltage $V_{BLP}$ by way of a corresponding pair of pre-charge transistors 114, 116.

The voltage $V_{BLP}$ is generated at voltage generator 124, which, in at least some example embodiments, maintains electrical connections to both the drain supply voltage and the source supply voltage. Conveniently, the bit line pre-charge supply is electrically coupled through a low power consumption enabling p-type MOS transistor 126 to the drain supply voltage such as, for example, $V_{SS}$.

During an access operation, the pre-charge voltage $V_{BLP}$ produced at output 107 is temporarily coupled to respective data bus signals db and db_b to initially charge the data bus signals to $V_{BLP}$ such as, for example, an intermediate voltage level between $V_{DD}$ and $V_{SS}$. Thus embodiments herein include a voltage generator 124 configured to produce pre-charge voltage $V_{BLP}$ for pre-charging one or more data bus signals. After the data bus signals are pre-charged, the transistors 114 and 116 are deactivated and a corresponding memory access can be completed.

Note that the different data bus signal pairs can be repeatedly pre-charged to the first voltage during the first mode setting for accessing the cells in the memory circuit.

As discussed above, the memory system according to embodiments herein can include an input such as, for example, /DPD (input 105) indicating whether a respective memory system is in a power-saving mode. As shown in FIG. 4, the memory system 100 can be configured to include one or more field effect transistors for adjusting a magnitude of the pre-charge voltage.

More specifically, the output 107 of voltage generator 124 can be electrically coupled to a higher voltage level when switch 126 is activated such that the output 107 varies depending on whether the memory system 100 is in a power-saving mode. During such a condition when transistor 126 (a voltage adjustor circuit) is activated, the output 107 changes from pre-charge voltage $V_{BLP}$ (for example, from value of half $V_{DD}$) to a voltage value at least substantially equal to voltage $V_{DD}$.

One way that changing the magnitude of output 107 reduces energy consumption is reduced leakage current. For example, during the power-saving mode, the driver circuitry is disabled such that signal wdb is set to logic high state equal to at least substantially $V_{DD}$. When output 107 is set to at least substantially $V_{DD}$ during the power-saving mode, less current flows along the path starting from $V_{DD}$, and passing through transistor 112A, along signal wdb, through transistor 120, through transistor 116, to output 107 of voltage generator 124. In other words, during the power-saving mode, switches 114, 116, 118, and 120 are set to an OFF state. However, a certain amount of current passes through the drain-sources connections in respective transistors, which results in the leakage on the above-mentioned path.

The drain-source orientation of the transistors in the above-mentioned can be a source of at least part of the current leakage between the voltage generator 124 and source $V_{DD}$. Setting the output 107 to a value near $V_{DD}$ during the power-saving mode reduces energy consumption that would otherwise result if the output 107 was maintained at a value of $V_{BLP}$ during the power-saving mode.

According to further configurations, depending on a configuration of write data bus driver circuit 102, note that it may be beneficial to set the output 107 of voltage generator 124 to a lower voltage value such as, for example, nearer a value of $V_{SS}$ during a power-saving mode. In accordance with such embodiments, instead of being pulled up to a voltage nearer $V_{DD}$, the output 107 can be pulled down to a value such as, for example, $V_{SS}$ to reduce energy consumption.

Accordingly, voltage generator 124 can different types of adjustor circuits to initiate adjusting a magnitude of the output 107. Of course, the circuitry as shown in FIG. 4 is presented by way of a non-limiting example and that the output 107 of voltage generator 124 can be adjusted in any of a number of suitable ways in addition to implementing a pull-up or pull-down circuit to achieve this end.

Figure 5:
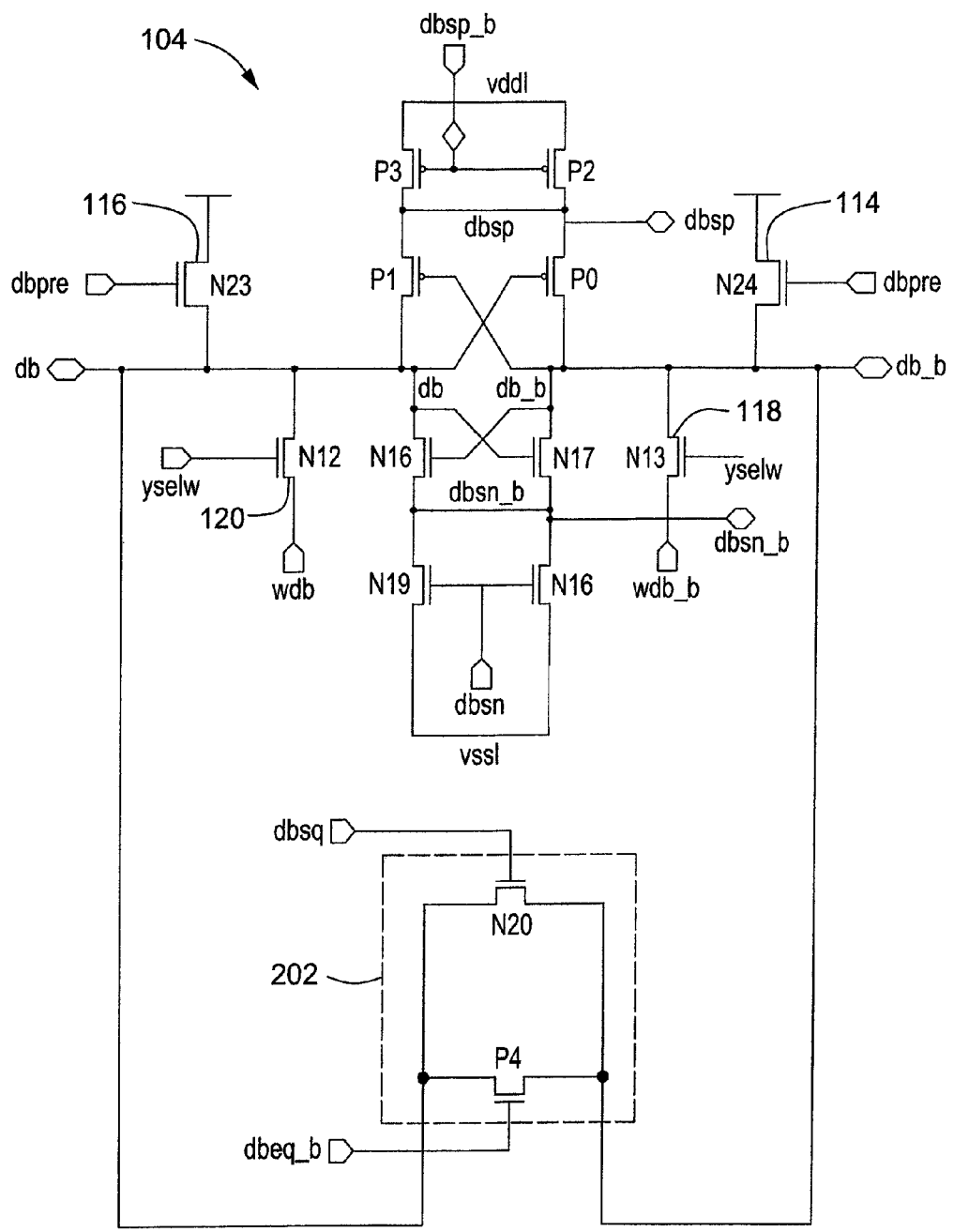
FIG. 5 is an example of a data bus circuit according to embodiments herein.

Reference will now be made to FIG. 5, which illustrates an example data bus circuit 104 according to embodiments herein. In the illustrated circuit schematic, it will be seen that certain control signals control the operation of an example data bus sense amplifier.

In particular, control signals dbsn, dbsn_b, dbsp and dbsp_b are activated at the start of sensing. The illustrated circuit also includes equilibration circuitry 202 comprising an NMOS transistor and a PMOS transistor switch receiving signals dbeq and dbeq_b, respectively, at the transistor gate.

When dbeq and dbeq_b are activated, the transistor switches turn on to create paths between db and db_b, and thus cause db and db_b to be brought to the same voltage level. Finally, operations of other circuit components and circuitry illustrated in FIG. 5 are well know to those skilled in the art, and thus such operations need not be explicitly described herein.

Reference will now be made to FIG. 6, which illustrates a bit line sense amplifier circuit 300 in accordance with an example embodiment. The illustrated circuit 300 includes switch circuitry 302, a bit line sense amplifier 306 and a so-called bit line equilibration circuitry 308. The switch circuitry 302 may comprise, for example, four pairs of NMOS switch transistors for selectively coupling the db, db_b pair to one of the bl<3:0>, bl_b<3:0> pairs under control of ysel<3:0> signals applied to the gates of the NMOS switch transistors.

With respect to the bit line equilibration circuitry 308, paths between the bit line pairs can be created or impeded based on bleq and bleq_b, and thus the bit line equilibration circuitry 308 controls when the bit lines are brought to the same voltage level. The bit line equilibration circuitry 308 also receives the bit line pre-charge voltage (blpre), which is the same as $V_{BLP}$ shown in FIG. 4. As the name implies, the bit line pre-charge voltage can be used for bit line pre-charging as understood by those skilled in the art.

In at least one example embodiments herein, the bit line equilibration circuitry 308 comprises, for each bit line pair, the circuitry shown in FIG. 7 (i.e. x4 for the illustrated example).

Reference will be made once again to FIG. 4. During typical operation, an asserted data bus pre-charge enable signal (dbpre) is received at the respective gates of the pair of pre-charge NMOS transistors 114, 116. Responsively, the pair of pre-charge NMOS transistors 114, 116 turn on and allow for current flow between the data bus lines, db and db_b, and the bit line pre-charge supply. Accordingly, both the data bus lines, db and db_b, become a value that is greater than the voltage on the bit line pre-charge supply by the amount of the respective threshold voltages of the pair of pre-charge NMOS transistors 114, 116.

In some examples, the pre-charge voltage on the bit line pre-charge supply line is to an intermediate value between $V_{DD}$ and $V_{SS}$ such as, for example, $0.5V_{DD}$, or, expressed in words, half of the drain supply voltage $V_{DD}$. In such a case, both the data bus lines, db and db_b, assume a value of $0.5V_{DD}$+Vtn, where Vtn is the threshold voltage of the corresponding one of the pair of pre-charge NMOS transistors 114, 116.

In the low power consumption mode, the write data bus (wdb) can be maintained at a value that is less than the drain supply voltage $V_{DD}$ by the threshold voltage of first upper NMOS transistor 112A. As mentioned above, unfortunately, while the low power consumption mode is active, a leakage path may be established between a bit line pre-charge supply line and the drain supply voltage VDD through the first upper NMOS transistor 112A, the column write selection NMOS transistor 120, and the bit line pre-charge NMOS transistor 116 associated with the data bus (signal db). The leakage path may be established without regard to whether the first upper NMOS transistor 112A, the column write selection NMOS transistor 120, and the bit line pre-charge NMOS transistor 116 are set to be conducting.

In overview, changing the output 107, to decrease the voltage difference between the voltage on the write data bus (wdb) and the bit line pre-charge voltage, can reduce the current flowing on the leakage path while the low power consumption mode is active.

In operation, upon activation of the low power consumption mode, a voltage on a low power consumption indicating line (such as, for example, /DPD or input 105) transitions from logic low to logic high when the memory system 100 switches from a power-saving mode to a non power-saving mode. Consequently, a voltage on an inverse low power consumption indicator line (/DPD) transitions from logic high to logic low when the memory system 100 switches from a non power-saving mode to the power-saving mode.

As previously discussed with respect to the above figures, responsive to the logic low state on the inverse low power consumption indicating line (/DPD), the low power consumption enabling PMOS transistor 126 turns on and begins conducting so that the voltage on the bit line pre-charge supply line is raised from the value provided by the bit line pre-charge generator 124 (for example, 0.5 VDD) to a value less than the drain supply voltage by the threshold of the low power consumption enabling PMOS transistor 126 (i.e., VDD−Vtp).

When the low power consumption mode is deactivated, the low power consumption enabling transistor 126 turns off, thereby isolating the bit line pre-charge supply from the drain supply voltage. Consequently, in this latter mode, the bit line pre-charge supply is allowed to return to the value $V_{BLP}$ supplied by the bit line pre-charge generator 124.

In some examples of low power consumption mode or power-saving mode, at least some power sources are on; however memory operations including self-refresh do not occur. Thus, stored data may be lost in the power-saving mode.

In some example embodiments, the memory system 100 and/or part thereof is embedded in a System-on-Chip (SoC). In other example embodiments, the memory device is a chip or multiple chips.

Figure 8:
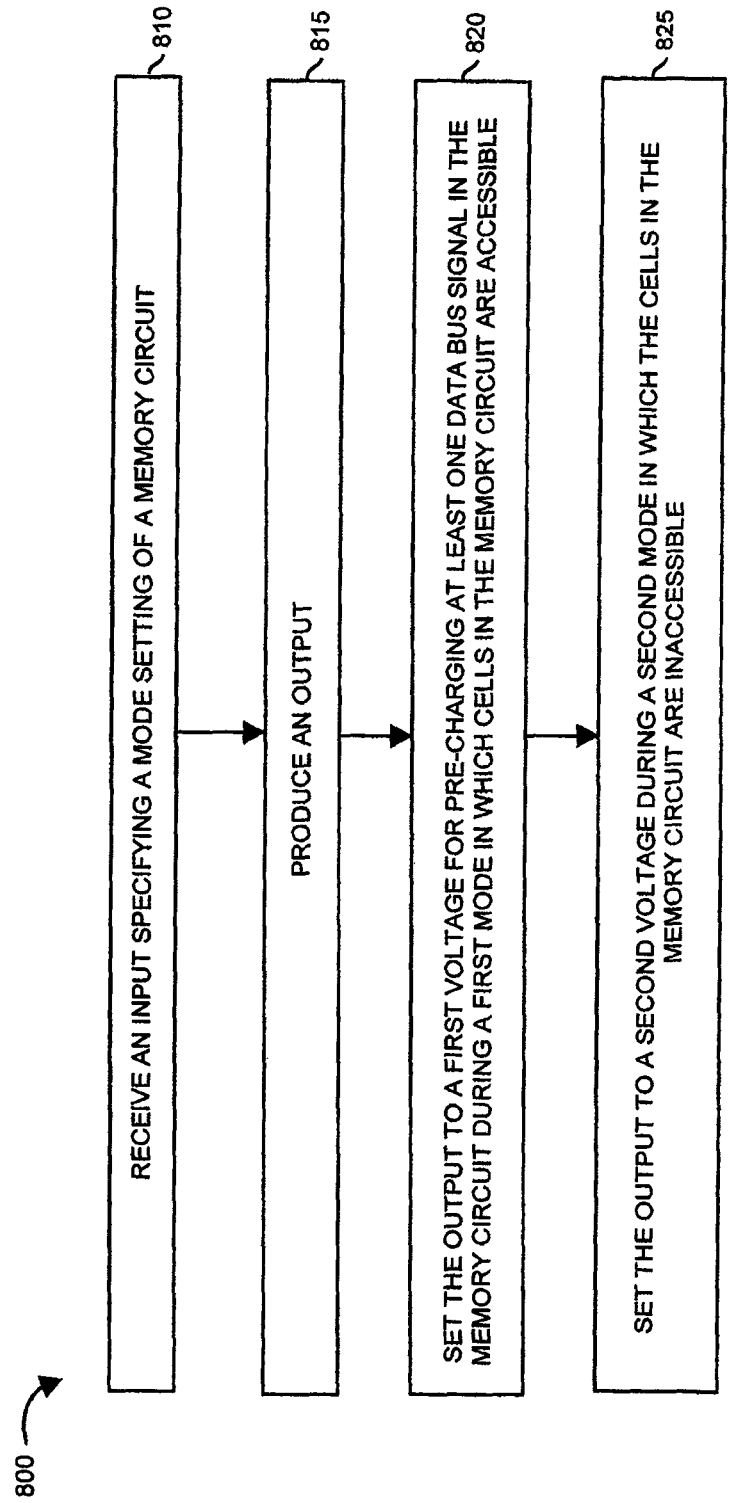
FIGS. 8-11 are example flowcharts illustrating methods for reducing power consumption in a memory system according to embodiments herein.

FIG. 8 is an example flowchart 800 illustrating a method associated with generating a pre-charge voltage according to embodiments herein. In general, flowchart 800 summarizes some of the concepts as further discussed above such as, for example, the techniques describing control of a pre-charge voltage in FIGS. 1-7.

For each of the flowcharts, note that an ordering of the steps in all of the flowcharts is by way of example only and that, in certain cases, steps may be performed in any suitable order.

In step 810, the voltage generator 124 receives an input 105 specifying a mode setting of a corresponding memory system 100.

In step 815, the voltage generator 124 produces an output 107.

In step 820, the transistor 126 associated with voltage generator 124 sets the output 107 to a first voltage for pre-charging one or more data bus signals in the memory system 100 during a first mode in which memory cells are accessible.

In step 825, the voltage generator 124 controls the output 107 to be a second voltage during a second mode during which the cells in the memory system 100 are inaccessible.

Figure 9:
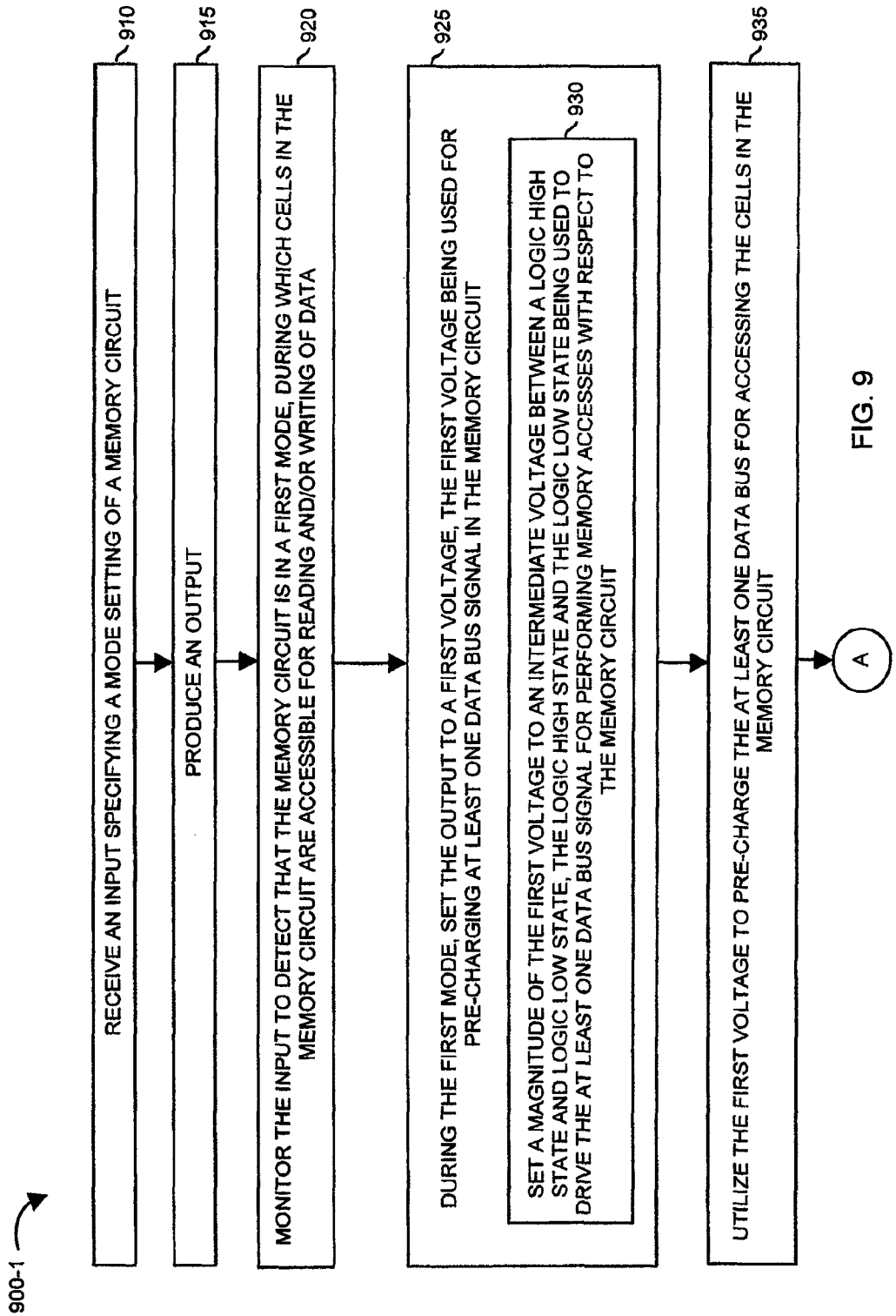
Figure 10:
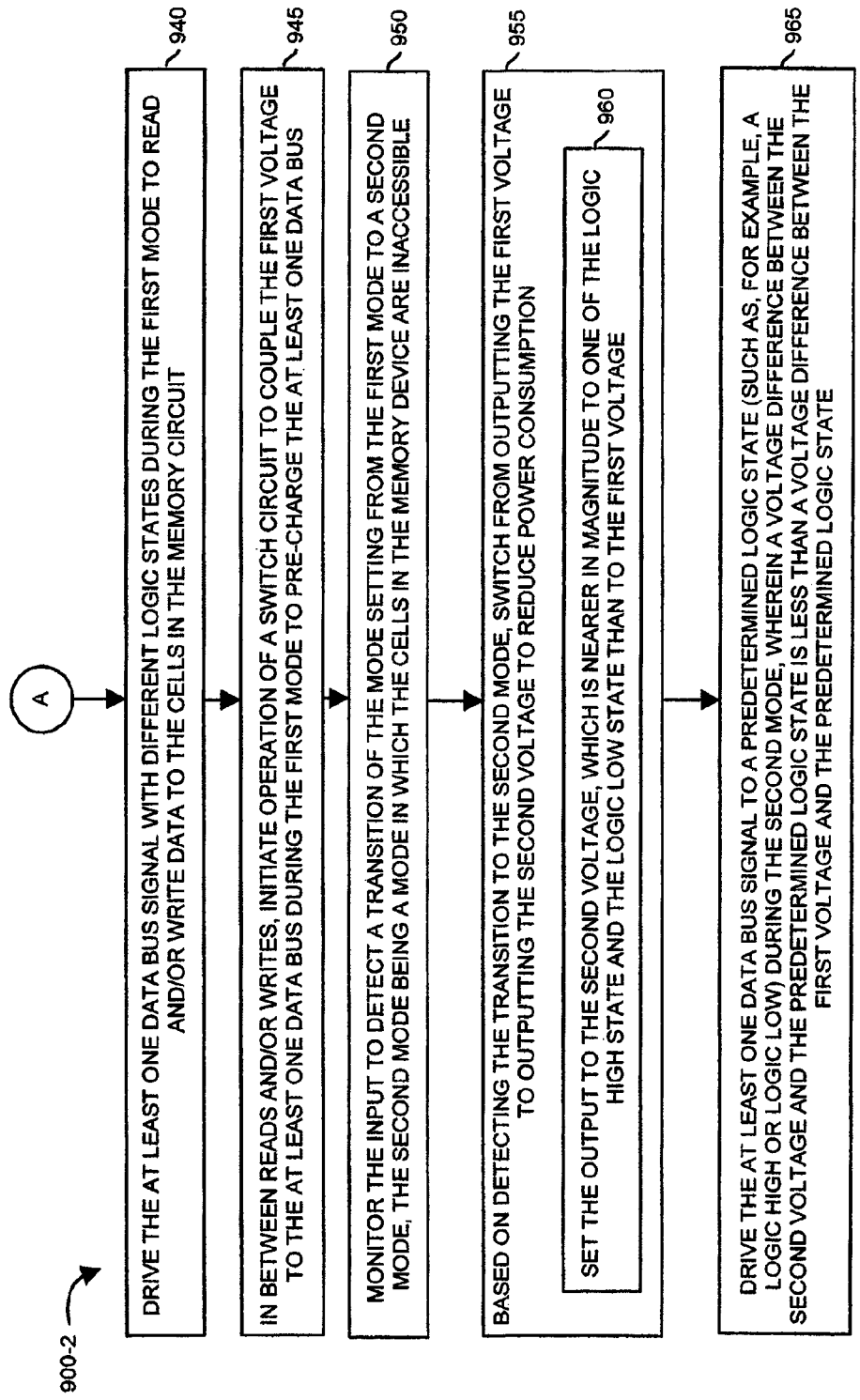

FIGS. 9 and 10 combine to form an example flowchart 900 (e.g., flowchart 900-1 and flowchart 900-2) illustrating a novel way to reduce power consumption according to embodiments herein. In general, flowchart 900 captures certain concepts such as, for example, adjusting the magnitude of a pre-charge voltage value as described herein in FIGS. 1-7. As mentioned, note again that an ordering of the steps in all of the flowcharts is by way of example only and that steps generally can be performed in any suitable order.

In step 910, the voltage generator 124 receives an input 105 specifying a mode setting of a memory system 100 and/or memory 135.

In step 915, the voltage generator 124 produces an output 107.

In step 920, the transistor 126 associated with voltage generator 124 monitors the input 105 to detect when the memory circuit or memory system 100 is set to a first mode, during which cells in the memory circuit are accessible for reading and/or writing of data.

In step 925, during the first mode as specified by the input 105, the voltage generator 124 sets the output 107 to a first voltage. In one embodiment, the first voltage is used for pre-charging one or more data bus signals in the memory system 100.

In sub-step 930, the voltage generator 124 sets a magnitude of the first voltage to an intermediate voltage between a logic high state and logic low state. The logic high state and the logic low state are used to drive the one or more data bus signal for performing memory accesses in the memory system 100.

In step 935, the voltage generator 124 utilizes the first voltage to pre-charge the one or more data bus signals for accessing the cells in the memory system 100.

In step 940, the write data bus drive circuitry 102 drives the one or more data bus signals with different logic states during the first mode to read and/or write data to the cells in the memory system 100.

In step 945, in between reads and/or writes, a control circuit such as, for example, a pre-charge voltage switch circuit 230 initiates operation of a switch circuit (for example, switch circuitry 240 and/or switch circuit 245) to couple the output 107 (set to a first voltage) to the one or more data bus signals during the first mode to pre-charge the one or more data bus signals.

In step 950, the transistor 126 associated with voltage generator 124 monitors the input 105 to detect a transition of the mode setting from the first mode to a second mode. This can include detecting a transition from a logic high to a logic low or vice-versa. The second mode indicates a mode in which the cells in the memory device are inaccessible.

In step 955, based on detecting the transition to the second mode as specified by the input 105, the transistor 126 associated with voltage generator 124 switches to an ON state to output the second voltage to reduce power consumption.

In step 960, output 107 is set to the second voltage, which is nearer in magnitude to one of the logic high state and the logic low state than to the first voltage.

In step 965, the write data bus driver circuit 102 drives the at least one data bus signal to a predetermined logic state (such as, for example, a logic high or logic low) during the second mode. To reduce power consumption, the voltage generator 124 generates the output 107 such that a voltage difference between the second voltage and the predetermined logic state is less than a voltage difference between the first voltage and the predetermined logic state.

Figure 11:
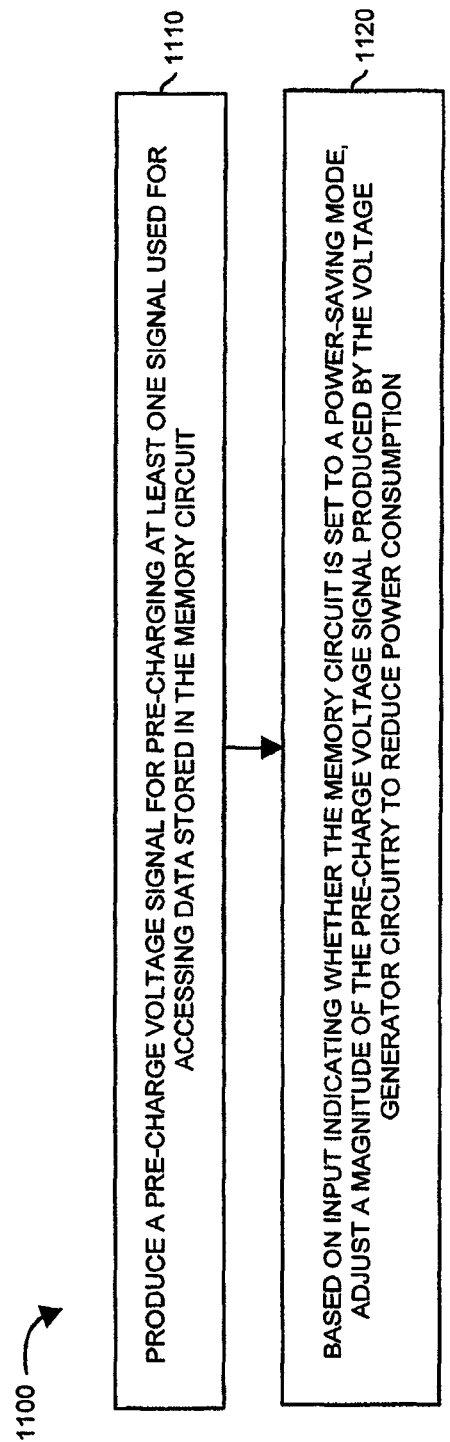

FIG. 11 is an example flowchart 1100 illustrating another method of adjusting a pre-charge voltage according to embodiments herein.

In step 1110, the voltage generator 124 produces a pre-charge voltage signal (output 107) for pre-charging at least one signal used for accessing data stored in the memory system 100.

In step 1120, based on input indicating whether the memory system 100 is set to a power-saving mode, the transistor 126 associated with voltage generator 124 adjusts a magnitude of the output 107 produced by the voltage generator 124 to reduce power consumption.

Certain adaptations and modifications of the described embodiments can be made. Therefore, the above-discussed embodiments are considered to be illustrative and not restrictive.

What is claimed is:
1. An integrated circuit comprising:
a data bus including a plurality of data bus lines;
a voltage generator circuit including:
an input configured to receive an input signal indicating one of a power saving mode and a non-power saving mode of operation of the integrated circuit; and
an output configured to provide a precharge voltage to at least one of the plurality of data bus lines,
the precharge voltage having a first value between a voltage value of a logic high state and a voltage value of logic low state when the input signal indi- cates that the integrated circuit is in the non-power saving mode of operation; and the precharge voltage having a second value nearer to one of the voltage value of the logic high state and the voltage value of the logic low state than the first value when the input signal indicates that the integrated circuit is in the power saving mode of operation.

2. The integrated circuit as claimed in claim 1, wherein the voltage generator circuit includes:

a voltage adjustor circuit configured to receive the input signal and adjust the precharge voltage.

3. The integrated circuit as claimed in claim 2, wherein the voltage adjustor circuit includes;

at least one field effect transistor configured to electrically couple the output to a higher voltage value than a voltage value of the pre-charge voltage signal as produced by the voltage generator circuit when the memory circuit is in the non-power saving mode of operation.

4. The integrated circuit as claimed in claim 1 further comprising:

a driver circuit configured to drive one or more of the plurality of data bus lines to different logic states.

5. The integrated circuit as claimed in claim 1 further comprising:

a switch circuit configured to selectively couple the output to one or more of the plurality of data bus lines.

6. The integrated circuit as claimed in claim 1 further comprising:

one or more field effect transistors configured to adjust a magnitude of the precharge voltage.

7. The integrated circuit as claimed in claim 1 further comprising:

a driver circuit configured to drive one or more of the plurality of data bus lines to different logic states;

a switch circuit configured to selectively couple the output to one or more of the plurality of data bus lines; and a current leakage path extending from the driver circuit along the at least one signal through the switch circuit to the voltage generator circuit, the respective switch circuit being oriented in the current leakage path such that a first node of the switch circuit is in electrical communication with the at least one data bus signal and a second node of the switch circuit is in electrical communication with the output.

8. The integrated circuit as claimed in claim 1 further comprising a sense amplifier configured to change the at least one of the plurality of data bus lines to one of the voltage value of the logic high state and the voltage value of the logic low state.

9. The integrated circuit as claimed in claim 1, wherein a type of the integrated circuit is selected from the group consisting of dynamic random-access memory (DRAM), static random-access memory (SRAM), pseudo-static random-access memory (PSRAM), resistive random-access memory (ReRAM), ferroelectric random-access (FeRAM), NAND Flash memory, NOR Flash memory, electrically erasable read-only memory (EEPROM), magnetoresistive random-access memory (MRAM), and phase change memory (PCM).

10. The integrated circuit as claimed in claim 1 wherein the first value is substantially half way between the voltage value of the logic high state and the voltage value of the logic low state.

11. A method of precharging a data bus signal in an integrated circuit, the method comprising:

receiving an input signal specifying a mode of operation of the integrated circuit;

determining whether the mode of operation is one of a non-power saving mode of operation and a power saving mode of operation;

precharging the data bus signal to a first value between a voltage value of a logic high state and a voltage value of a logic low state when the input signal specifies the integrated circuit is in the non-power saving mode of operation; and precharging the data bus signal to a second value nearer to one of the voltage value of the logic high state and the voltage value of the logic low state than the first value when input signal indicates that the integrated circuit is in the power saving mode of operation.

12. The method as claimed in claim 11 wherein precharging the data bus signal to the first value includes precharging the data bus signal to a value substantially half way between the voltage value of the logic high state and the voltage value of the logic low state.

13. The method as claimed in claim 11 wherein precharging the data bus signal to the second value nearer to one of the voltage value of the logic high state and the voltage value of the logic low state includes precharging the data bus signal to one of the voltage value of the logic high state and the voltage value of the logic low state.

* * * * *